(12) United States Patent
Tian

(10) Patent No.: US 7,181,388 B2
(45) Date of Patent: Feb. 20, 2007

(54) METHOD FOR COMPRESSING DICTIONARY DATA

(75) Inventor: Jilei Tian, Tampere (FI)

(73) Assignee: Nokia Corporation, Espoo (FI)

( * ) Notice: Subject to any disclaimer, the term of this patent is extended or adjusted under 35 U.S.C. 154(b) by 845 days.

(21) Appl. No.: 10/292,122

(22) Filed: Nov. 11, 2002

(65) Prior Publication Data

US 2003/0120482 A1 Jun. 26, 2003

(30) Foreign Application Priority Data

Nov. 12, 2001 (FI) .................................. 20012193

(51) Int. Cl.
*G06F 17/21* (2006.01)
(52) U.S. Cl. ............................. 704/10; 704/1
(58) Field of Classification Search .................... 704/1, 704/10, 256
See application file for complete search history.

(56) References Cited

U.S. PATENT DOCUMENTS

| 4,759,068 A | 7/1988 | Bahl et al. |
| 5,845,238 A | 12/1998 | Fredenburg |
| 5,861,827 A * | 1/1999 | Welch et al. ................. 341/51 |
| 5,930,754 A | 7/1999 | Karaali et al. |
| 6,178,397 B1 | 1/2001 | Fredenburg |
| 6,789,066 B2 * | 9/2004 | Junkins et al. ............... 704/500 |
| 7,080,005 B1 * | 7/2006 | Kao ............................. 704/10 |

OTHER PUBLICATIONS

Jul. Oct. 1948, C.E. Shannon, A Mathematical Theory of Communication, *The Bell System Technical Journal*, vol. 27, p. 379-423, 623-656.
*Speech Recognition System Design and Implementation Issues*, p. 322-342.
*Decision Tree Based Text-to-Phoneme Mapping for Speech Recognition:* (presented Oct. 16-20, 2000 Beijing).

* cited by examiner

*Primary Examiner*—Tālivaldis Ivars Šmits
*Assistant Examiner*—Eunice Ng
(74) *Attorney, Agent, or Firm*—Hollingsworth & Funk, LLC

(57) ABSTRACT

The invention relates to pre-processing of a pronunciation dictionary for compression in a data processing device, the pronunciation dictionary comprising at least one entry, the entry comprising a sequence of character units and a sequence of phoneme units. According to one aspect of the invention the sequence of character units and the sequence of phoneme units are aligned using a statistical algorithm. The aligned sequence of character units and aligned sequence of phoneme units are interleaved by inserting each phoneme unit at a predetermined location relative to the corresponding character unit.

15 Claims, 6 Drawing Sheets

METHOD FOR COMPRESSING DICTIONARY DATA

BACKGROUND OF THE INVENTION

The invention relates to speaker-independent speech recognition, and more precisely to the compression of a pronunciation dictionary.

Different speech recognition applications have been developed during recent years for instance for car user interfaces and mobile terminals, such as mobile phones, PDA devices and portable computers. Known methods for mobile terminals include methods for calling a particular person by saying aloud his/her name into the microphone of the mobile terminal and by setting up a call to the number according to the name said by the user. However, present speaker-dependent methods usually require that the speech recognition system is trained to recognize the pronunciation for each name. Speaker-independent speech recognition improves the usability of a speech-controlled user interface, because the training stage can be omitted. In speaker-independent name selection, the pronunciation of names can be stored beforehand, and the name spoken by the user can be identified with the pre-defined pronunciation, such as a phoneme sequence. Although in many languages pronunciation of many words can be represented by rules, or even models, the pronunciation of some words can still not be correctly generated by these rules or models. However, in many languages, the pronunciation cannot be represented by general pronunciation rules, but each word has a specific pronunciation. In these languages, speech recognition relies on the use of so-called pronunciation dictionaries in which a written form of each word of the language and the phonetic representation of its pronunciation are stored in a list-like structure.

In mobile phones the memory size is often limited due to reasons of cost and hardware size. This imposes limitations also on speech recognition applications. In a device capable of having multiple user interface languages, the speaker-independent speech recognition solution often uses pronunciation dictionaries. Because a pronunciation dictionary is usually large, e.g. 37 KB for two thousand names, it needs to be compressed for storage. Broadly speaking, most text compression methods fall into two classes: dictionary-based and statistics-based. There are several different implementations at the dictionary-based compression, e.g. LZ77/78 and LZW (Lempel-Ziv-Welch). By combining a statistical method, e.g. arithmetic coding, with powerful modelling techniques, a better performance can be achieved than with dictionary-based methods alone. However, the problem with the statistical based method is that it requires a large working memory (buffer) during the decompression process. Therefore this solution is not suitable for use in small portable electronic devices such as mobile terminals.

Although the existing compression methods are good in general, the compression of the pronunciation dictionaries is not efficient enough for portable devices.

BRIEF DESCRIPTION OF THE INVENTION

The object of the invention is to provide a more efficient compression method for compressing a pronunciation dictionary. The object of the invention is achieved with a method, electronic devices, a system and a computer program product that are characterized by what is disclosed in the independent claims. The preferred embodiments of the invention are set forth in the dependent claims.

According to a first aspect of the invention, the pronunciation dictionary is pre-processed before the compression. The pre-processing can be used together with any method for compressing a dictionary. In the pre-processing each entry in the pronunciation dictionary is aligned using a statistical algorithm. During the alignment, a sequence of character units and a sequence of phoneme units are modified to have an equal number of units in the sequences. The aligned sequences of character units and phoneme units are then interleaved so that each phoneme unit is inserted at a predetermined location relative to the corresponding character unit.

A sequence of character units is typically a text sequence containing letters. Depending on the language, the alphabetical set can be extended to include more letters or symbols than the conventional English alphabet.

A sequence of phoneme units represents the pronunciation of the word and it usually contains letters and symbols, e.g. '@', 'A:', '{' in SAMPA (Speech Assessment Methods Phonetic Alphabet) notation. The phonetic alphabet can also contain non-printable characters. Because one phoneme can be represented with more than one letter or symbol, the phonemes are separated by a whitespace character.

According to a second aspect of the invention, an electronic device is configured to convert a text string input into a sequence of phoneme units. A pre-processed pronunciation dictionary comprising entries, the entries comprising a first set of units comprising character units and a second set of units comprising phoneme units, wherein the units of the first set and the units of the second set are aligned and interleaved by inserting each phoneme unit at a predetermined location relative to the corresponding character unit, is stored into the memory of the device. A matching entry for the text string input is found from the pre-processed pronunciation dictionary by using the units of the first set of units of the entry form the predetermined locations. From the matching entry units of the second set of units are selected and concatenated into a sequence of phoneme units. Also the empty spaces are removed from the sequence of phoneme units.

According to a third aspect of the invention, an electronic device is configured to convert a speech information input into a sequence of character units. A pre-processed pronunciation dictionary comprising entries, the entries comprising a first set of units comprising character units and a second set of units comprising phoneme units, wherein the units of the first set and the units of the second set are aligned and interleaved by inserting each phoneme unit at a predetermined location relative to the corresponding character unit, is stored into the memory of the device. Pronunciation models for each entry's phonemic representation are either stored into the memory together with the pronunciation dictionary or created during the process. A matching entry for the speech information is found by comparing the speech information to the pronunciation models and selecting the most corresponding entry. From the matching entry units of the first set of units are selected and concatenated into a sequence of character units. Finally the empty spaces are removed from the sequence of character units.

One advantage of the invention is that with the described pre-processing, the entropy (H) of the dictionary is lowered. According to information theory, a low entropy rate (H) indicates that a more effective compression can be achieved, since the entropy rate determines the lower limit for compression (the compression ratio with the best possible non-lossy compression). This enables better compression, and the memory requirement is smaller. Furthermore, the pronunciation dictionary is relatively simple and fast to apply for speech recognition.

In one embodiment of the invention the HMM-Viterbi algorithm is adapted to be used for the alignment. The HMM-Viterbi algorithm ensures that the alignment is performed in an optimal manner in the statistical sense, and therefore minimizes the leftover entropy of the dictionary entry. Furthermore, an advantage of using the HMM-Viterbi algorithm in the alignment is that a more optimal alignment in the statistical sense can be reached.

In another embodiment of the invention a mapping step is added to the pre-processing. The mapping can be done either before or after the alignment. In this step, each phoneme unit is mapped into one symbol and instead of the phoneme units being represented by multiple characters, a single symbol is used to denote the phoneme units. By using the mapping technique, the whitespace characters can be removed from the entry, and yet decoding of the interleaved sequence is still possible. The removal of whitespace characters further improves the compression ratio. Additionally, an advantage of the mapping is that the method can be adapted to multiple languages, or even a large mapping table for all the languages in the device can be used.

BRIEF DESCRIPTION OF THE DRAWINGS

In the following, the invention will be described in further detail by means of preferred embodiments and with reference to the accompanying drawings, in which.

DETAILED DESCRIPTION OF THE INVENTION

Figure 1:
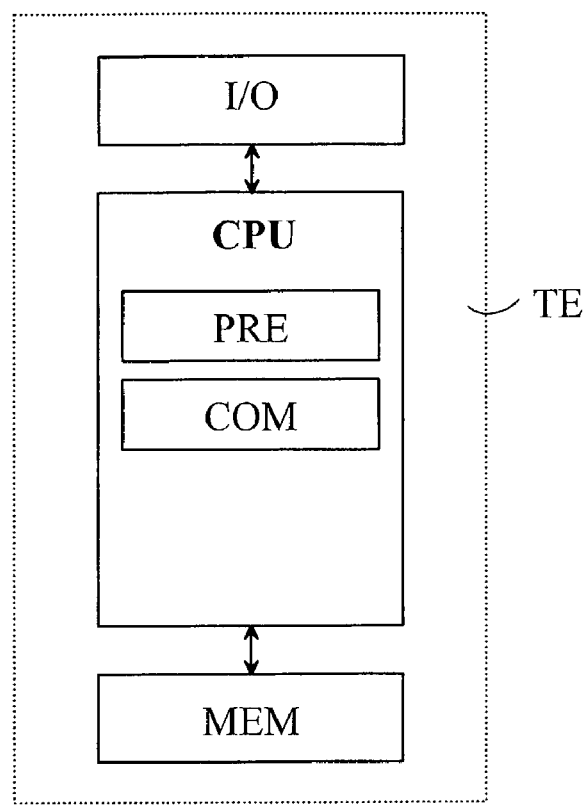
FIG. 1 is a block diagram illustrating a data processing device, which supports the pre-processing and compression of the pronunciation dictionary according to one preferred embodiment of the invention.

FIG. 1 illustrates a data processing device (TE) only for the parts relevant to a preferred embodiment of the invention. The data processing device (TE) can be, for example, a personal computer (PC) or a mobile terminal. The data processing unit (TE) comprises I/O means (I/O), a central processing unit (CPU) and memory (MEM). The memory (MEM) comprises a read-only memory ROM portion and a rewriteable portion, such as a random access memory RAM and FLASH memory. The information used to communicate with different external parties, e.g. a CD-rom, other devices and the user, is transmitted through the I/O means (I/O) to/from the central processing unit (CPU). The central processing unit (CPU) provides a pre-processing block (PRE) and a compression block (COM). The functionality of these blocks is typically implemented by executing a software code in a processor, but it can also be implemented with a hardware solution (e.g. an ASIC) or as a combination of these two. The pre-processing block (PRE) provides the pre-processing steps of a preferred embodiment illustrated in detail in FIG. 2. The compression block (COM) provides the compression of the pronunciation dictionary, for which purpose several different compression methods, e.g. LZ77, LZW or arithmetic coding, can be used. The pre-processing can be combined with any of the other compression methods to improve the compression efficiency.

The pronunciation dictionary that needs to be pre-processed and compressed is stored in the memory (MEM). The dictionary can also be downloaded from an external memory device, e.g. from a CD-ROM or a network, using the I/O means (I/O). The pronunciation dictionary comprises entries that, in turn, each include a word in a sequence of character units (text sequence) and in a sequence of phoneme units (phoneme sequence). The sequence of phoneme units represents the pronunciation of the sequence of character units. The representation of the phoneme units is dependent on the phoneme notation system used. Several different phoneme notation systems can be used, e.g. SAMPA and IPA. SAMPA (Speech Assessment Methods Phonetic Alphabet) is a machine-readable phonetic alphabet. The International Phonetic Association provides a notational standard, the International Phonetic Alphabet (IPA), for the phonetic representation of numerous languages. A dictionary entry using the SAMPA phoneme notation system could be for example:

| Text Sequence | Phoneme Sequence | Entry |
|---|---|---|
| Father | F A: D @ | Father f A: D @ |

Entropy, denoted by H, is a basic attribute, which characterises the data content of the signal. It is possible to find the shortest way to present a signal (compress it) without losing any data. The length of the shortest representation is indicated by the entropy of the signal. Instead of counting the exact entropy value individually for each signal, a method to estimate it has been established by Shannon (see, for example, C. E. Shannon, A Mathematical Theory of Communication, The Bell System Technical Journal, Vol. 27, pp. 379–423, 623–656, July, October, 1948). This will be described briefly in the following.

Let $P(l_j | l_i)$ be the conditional probability that the present character is the jth letter in the alphabet, given that the previous character is the ith letter, and $P(l_i)$ the probability that the previous character is the ith letter of the alphabet. The entropy rate $H_2$ of the second order statistics is $$H_2 = -\sum_{i=1}^{m} P(l_i) \cdot \sum_{j=1}^{m} P(l_j | l_i) \cdot \log_2 P(l_j | l_i) \qquad (1)$$

The entropy rate H in a general case is given by $$H = \lim_{n \to \infty} -\frac{1}{n} \sum p(B_n) \cdot \log_2 p(B_n) \qquad (2)$$

where $B_n$ represents the first characters. It is virtually impossible to calculate the entropy rate according to the above equation (2). Using this prediction method of equation (1), it is possible to estimate that the entropy rate of an English text of 27 characters is approximately 2.3 bits/character.

To improve the compression of a pronunciation dictionary, pre-processing of the text is used to lower its entropy.

Figure 2:
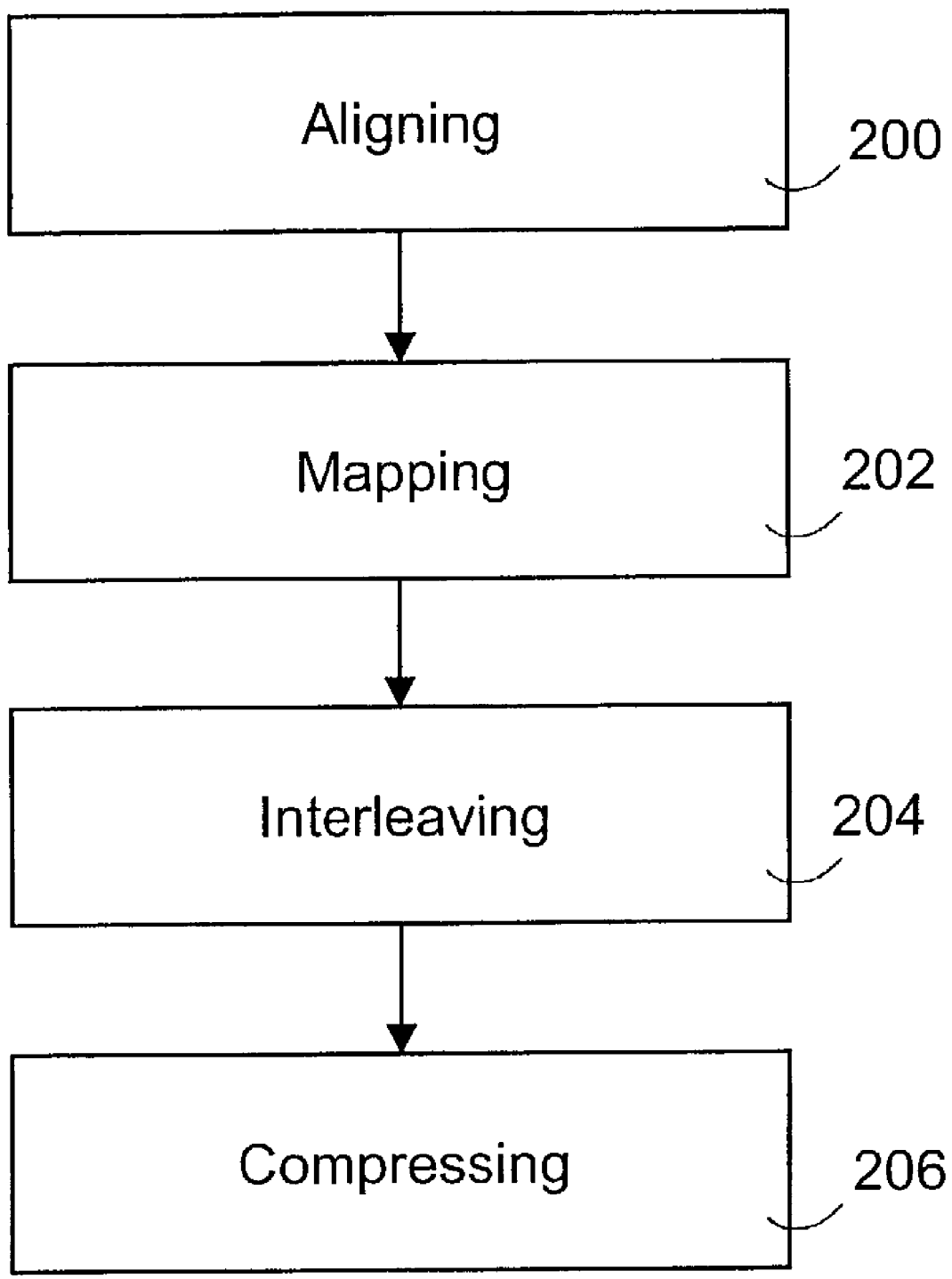
FIG. 2 is a flow chart of a method according to a preferred embodiment of the invention.

FIG. 2 illustrates a method according to a preferred embodiment of the invention. The method concentrates on the pre-processing of the pronunciation dictionary to lower the entropy rate (H).

Each entry is aligned (200), i.e. the text and phoneme sequences are modified in order to have as many phoneme units in the phoneme sequence as there are character units in the text sequence. In the English language, for example, a letter may correspond to zero, one, or two phonemes. The alignment is obtained by inserting graphemic or phonemic epsilons (nulls) between the letters in the text string, or between the phonemes in the phoneme sequence. The use of graphemic epsilons can be avoided by introducing a short list of pseudophonemes that are obtained by concatenating two phonemes that are known to correspond to a single letter, for example, "x->k s". In order to align the entries, the set of allowed phonemes has to be defined for each letter. The phoneme list includes the pseudophonemes for the letter and the possible phonemic epsilon. The general principle is to insert a graphemic null (defined as epsilon) into the text sequence and/or a phonemic null (also called an epsilon) into the phoneme sequence when needed. Below is the word used above as an example after alignment.

| Text Sequence | Phoneme Sequence | Aligned Entry |
|---|---|---|
| father | f A: D @ | father f A: D ϵ ϵ @ |

Here, the word 'father' has 6 units and after aligning there are 6 phonemes in the phoneme sequence; 'f A: D ϵ ϵ @'. The aligning can be done in several different ways. According to one embodiment of the invention the alignment is done with the HMM-Viterbi algorithm. The principle of the alignment is illustrated and described in more detail in FIG. 3.

After aligning (200) each phoneme used in the phoneme notation system is preferably mapped (202) into a single symbol, for example, one byte ASCII code. However, mapping is not necessary to achieve the benefits of the invention, but can further improve them. The mapping can be represented, for example, in a mapping table. Below is an example of how the phonemes in the word used as an example could be mapped:

| Phoneme Symbol | ASCII number | ASCII symbol |
|---|---|---|
| f | 0x66 | f |
| A: | 0x41 | A |
| D | 0x44 | D |
| @ | 0x40 | @ |
| ϵ | 0x5F | _ |

By representing each phoneme with one symbol, the two characters representing one phoneme unit can be replaced with just one 8-bit ASCII symbol. As a result, the example is:

| Phoneme Sequence | Mapped Sequence (ASCII numbers) | Mapped Sequence (symbols) |
|---|---|---|
| f A: D ϵ ϵ @ | 0x66 0x41 0x44 0x5F 0x5F 0x40 | f A D _ _ @ |

After representing the phonemes with one symbol the spaces between the units can be removed. Also the space between the text sequence and the mapped and aligned phoneme sequence can be removed because there is an equal number of units in both sequences and it is clear which characters belong to the text and which to the phonetic representation.

Aligned and Mapped Entry

FatherfAD__@

Mapping the phoneme units to single symbols (202) is an important step for interleaving, since the whitespace characters can be avoided. Mapping also further enhances the end result in itself, since single characters take less space compared to, for example, two-character combinations, and the correlation to the corresponding text character is increased. The order of aligning (200) and mapping (202) does not affect the end result, the mapping (202) can be carried out before aligning as well.

The mapping table is only dependent on the phoneme notation method used in the pronunciation dictionary. It can be implemented to be language-independent so that different systems or implementations are not needed for different dialects or languages. If a plurality of pronunciation dictionaries use in a different phoneme notation methods were used, there would be a need for separate mapping tables for each phoneme notation method.

After aligning (200) and mapping (202), the entries are interleaved (204). Since the character ->phoneme pattern has a higher probability (lower entropy) than the consecutive letter pattern, especially if the alignment has been carried out optimally, redundancy is increased. This can be done by inserting pronunciation phonemes between the letters of the word to form a single word. In other words, the phoneme units are inserted next to the corresponding character units. After aligning (200), the text sequence and the phoneme sequence have an equal number of symbols and the character-phoneme pair is easy to find. For example:

| Text Sequence | Phoneme Sequence | Interleaved Entry |
|---|---|---|
| father | FAD__@ | ffaAtDh_e_r@ | where italic and bold symbols stand for pronunciation phonemes. It is obvious from the example that composing and decomposing an entry between the original and new formats are uniquely defined, since the text sequence and the phoneme sequence, that are interleaved, contain an equal number of units.

After the pre-processing, the compression (206) of the preprocessed phoneme dictionary can be carried out.

Figure 3:
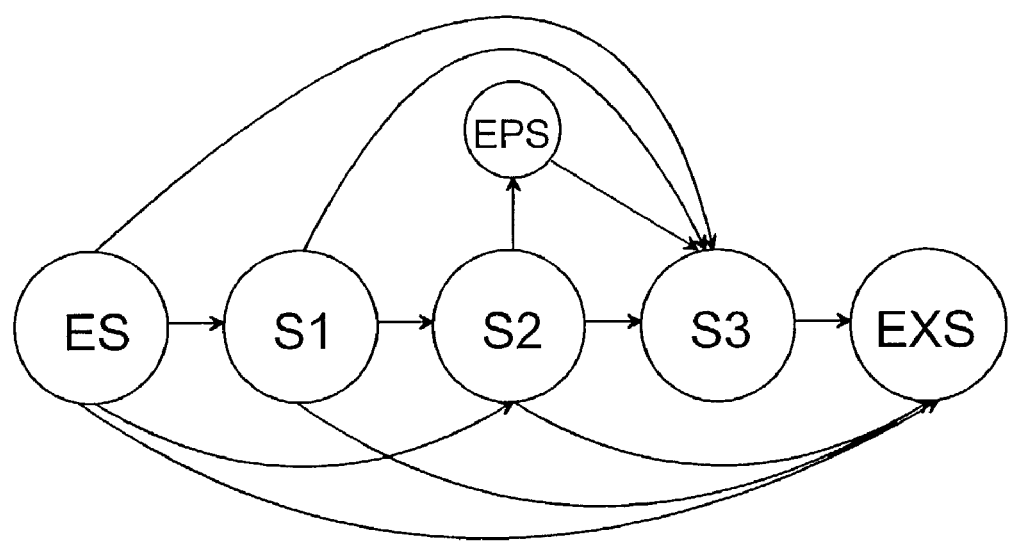
FIG. 3 illustrates the use of the HMM algorithm for the alignment of the pronunciation dictionary.

FIG. 3 illustrates the grapheme HMM for aligning the textual and phonetic representations of an entry.

The Hidden Markov Model (HMM) is a well-known and widely used statistical method that has been applied for example in speech recognition. These models are also referred to as Markov sources or probabilistic functions of the Markov chain. The underlying assumption of the HMM is that a signal can be well characterized as a parametric random process, and that the parameters of the stochastic process can be determined/estimated in a precise, well-defined manner. The HMMs can be classified into discrete models and continuous models according to whether observable events assigned to each state are discrete, such as codewords, or whether they are continuous. In either case, the observation is probabilistic. The model in the underlying stochastic process is not directly observable (it is hidden) but can be seen only through another set of stochastic processes that produce the sequence of observations. The HMM is composed of hidden states with transition between the states. The mathematical representation includes three items: state transition probability between the states, observation probability of each state and initial state distribution. Given HMM and observation, the Viterbi algorithm is used to give the observation state alignment through following the best path.

It is acknowledged in the current invention that the HMM can be used to solve the problem of optimal alignment of an observed sequence to the states of the Hidden Markov Model. Furthermore, the Viterbi algorithm can be used in connection with the HMM to find the optimal alignment. More information about the Hidden Markov Models and their applications can be found e.g. from the book "Speech Recognition System Design and Implementation Issues", pp. 322–342.

First, for a given letter-phoneme pair, the penalties p(fll) are initialised with zero if the phoneme f can be found in the list of the allowed phonemes of the letter l, otherwise they are initialised with large positive values. With the initial penalty values, the dictionary is aligned in two steps. In the first step, all possible alignments are generated for each entry in the dictionary. Based on all the aligned entries, the penalty values are then re-scored. In the second step, only a single best alignment is found for each entry.

For each entry, the optimal alignment is found with the Viterbi algorithm on the grapheme HMM. The grapheme HMM has entry (ES), exit (EXS) and letter states (S1, S2 and S3). The letters that may map to pseudophonemes are handled by having a duration state (EPS). The states 1 to 3 (S1, S2, S3) are the states that correspond to the letters in the word. State 2 (S2) corresponds to a letter that may produce a pseudophoneme. Skips from all previous states to the current state are allowed in order to support the phonemic epsilons.

Each state and the duration state hold a token that contains a cumulative penalty (as a sum of logarithmic probabilities) of aligning the phoneme sequence against the grapheme HMM and the state sequences that correspond to the cumulative score. The phoneme sequence is aligned against letters by going through the phoneme sequence from the beginning to the end one phoneme at a time. In order to find the Viterbi alignment between the letters and the phonemes, token passing is carried out. As the tokens pass from one state to another, they gather the penalty from each state. Token passing may also involve splitting tokens and combining or selecting tokens to enter the next state. The token that in the end has the lowest cumulative penalty is found over all the states of the HMM. Based on the state sequence of the token, the alignment between the letters of the word and the phonemes can be determined.

The alignment works properly for most entries, but there are some special entries that cannot be aligned. In such cases, another simple alignment is applied: graphemic or phonemic epsilons are added to the end of the letter or phoneme sequences.

Figure 4:
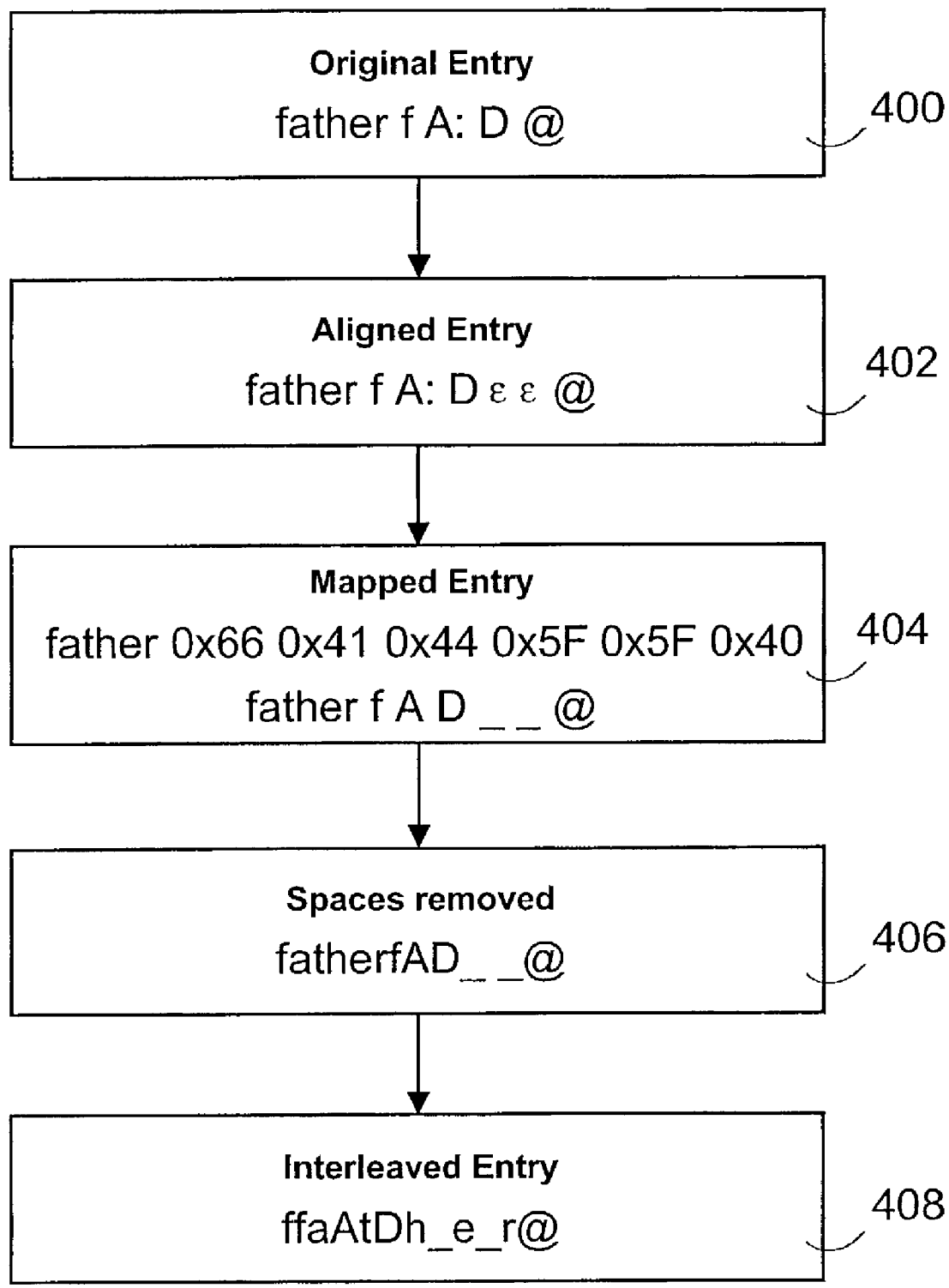
FIG. 4 shows the pre-processing steps for one dictionary entry.

FIG. 4 illustrates in more detail the pre-processing of the entry used as an example according to a preferred embodiment of the invention.

The original entry (400) has the two parts, a text sequence 'father' and a phoneme sequence 'f A: D @'. These two sequences are separated with a whitespace character and also the phoneme units are separated with whitespace characters.

In aligning (402) the phonemic and graphemic epsilons are added to have an equal number of units in both sequences. In the example word two phonemic epsilons are needed and the result of the phoneme sequence is 'f A: D ϵ ϵ @'.

The mapping (404) of the phoneme units into one symbol representation changes only the phoneme sequence. After mapping the phoneme sequence of the example word is 'f A D___@'.

When the entry is mapped (404) it is possible to remove the white space characters (406). As a result there is one string 'fatherfAD___@'.

The last step is interleaving (408) and the example entry is 'ffaAtDh_e_r@'. Now the entry can be processed further, for instance, it can be compressed.

All these steps are described in more detail in FIG. 2.

The pre-processing method described above, including also mapping (202), was tested experimentally. The experiment was carried out using the Carnegie Mellon University Pronouncing Dictionary, which is a pronunciation dictionary for North American English that contains more than 100,000 words and their transcriptions. In the experiment the performance was evaluated first by using typical dictionary-based compression methods, LZ77 and LZW, and a statistical based compression method, the 2nd order arithmetic compression. The performance was then tested with the preprocessing method together with the compression methods (LZ77, LZW and arithmetic). In Table 1 the results, given in kilobytes, show that the preprocessing method performs better in all cases. In general, it can be used with any compression algorithms.

TABLE 1

Compression performance comparison, tested using the CMU English pronunciation dictionary. The results are in kilobytes.

| Method | Before compression | Compr. without pre-proc. | Compr. with pre-proc. | Improvement |
|---|---|---|---|---|
| LZ77 | 2580 | 1181 | 940 | 20.4% |
| LZW | 2580 | 1315 | 822 | 37.5% |
| Arithmetic | 2580 | 899 | 501 | 44.3% |

As we can see from Table 1, the pre-processing improves the compression with all compression methods. Combined with the LZ77 compression method, the pre-processing improved the compression by over 20%. The improvement is even larger when the pre-processing was combined with the LZW method or with the Arithmetic method, providing about 40% better compression.

It should be understood that the invention can be applied to any general-purpose dictionary that is used in speech recognition and speech synthesis or all the applications when a pronunciation dictionary needs to be stored with efficient memory usage. It is also possible to apply the invention to the compression of any other lists comprising groups of textual entries that have a high correlation on the character level, for example, common dictionaries showing all the forms of a word and spell-checker programs.

Figure 5:
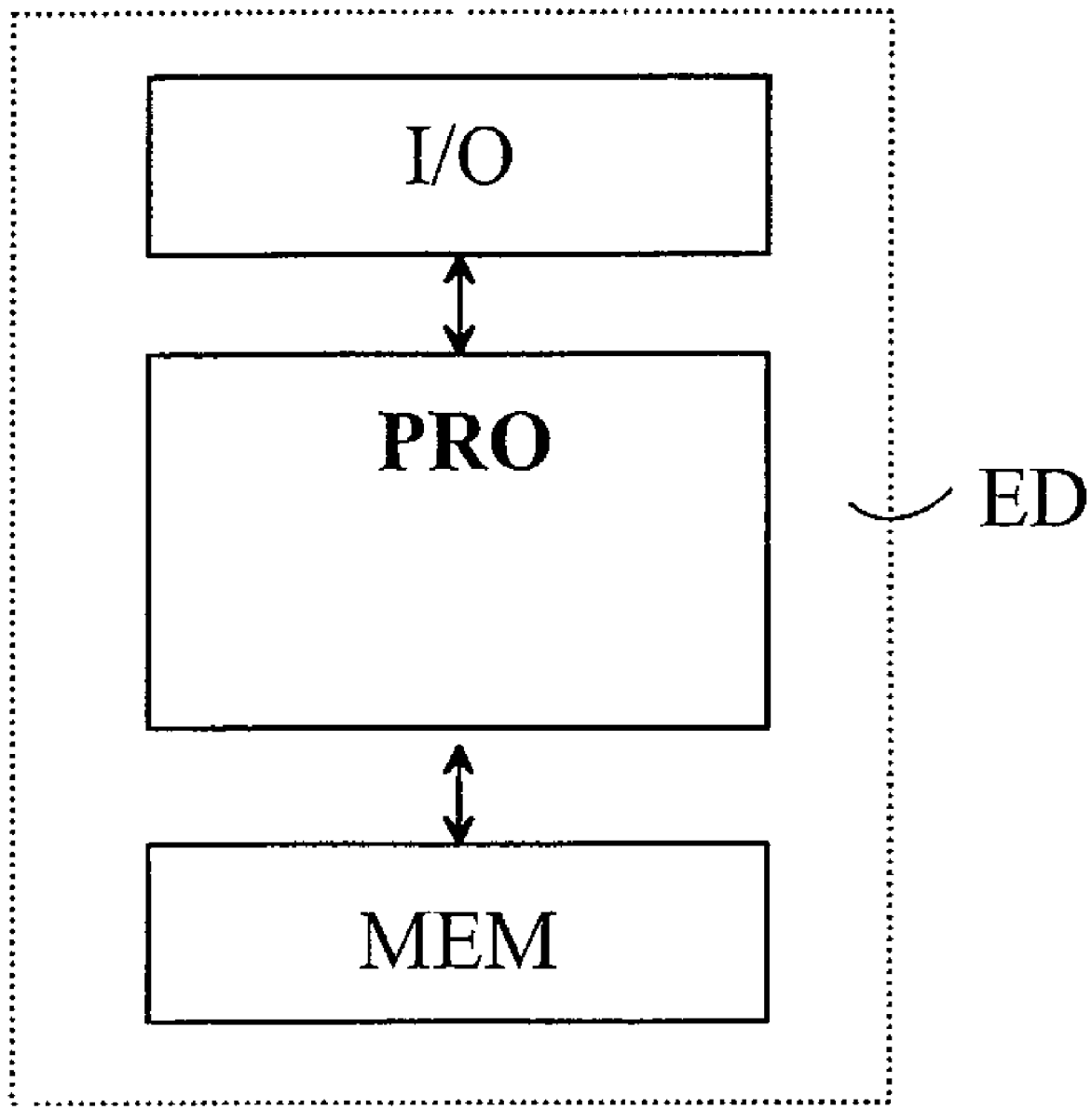
FIG. 5 is a block diagram illustrating an electronic device, which uses the pre-processed pronunciation dictionary.

FIG. 5 illustrates an electronic device (ED) only for the parts relevant to a preferred embodiment of the invention. The electronic device (ED) can be e.g. a PDA device, a mobile terminal, a personal computer (PC) or even any accessory device intended to be used with these, e.g. an intelligent head-set or a remote control device. The electronic device (ED) comprises I/O means (IO), a central processing unit (PRO) and memory (ME). The memory (ME) comprises a read-only memory ROM portion and a rewriteable portion, such as a random access memory RAM and FLASH memory. The information used for communicating with different external parties, e.g. the network, other devices or the user, is transmitted through the I/O means (IO) to/from the central processing unit (PRO). The user interface, such as a microphone or a keypad enabling a character sequence to be fed into the device, is thus part of the I/O means (IO). A pre-processed pronunciation dictionary can be downloaded from the data processing device (TE) into the electronic device (ED) through the I/O means (IO), for example, as a download from the network. The dictionary is then stored into the memory (ME) for further usage.

Figure 6:
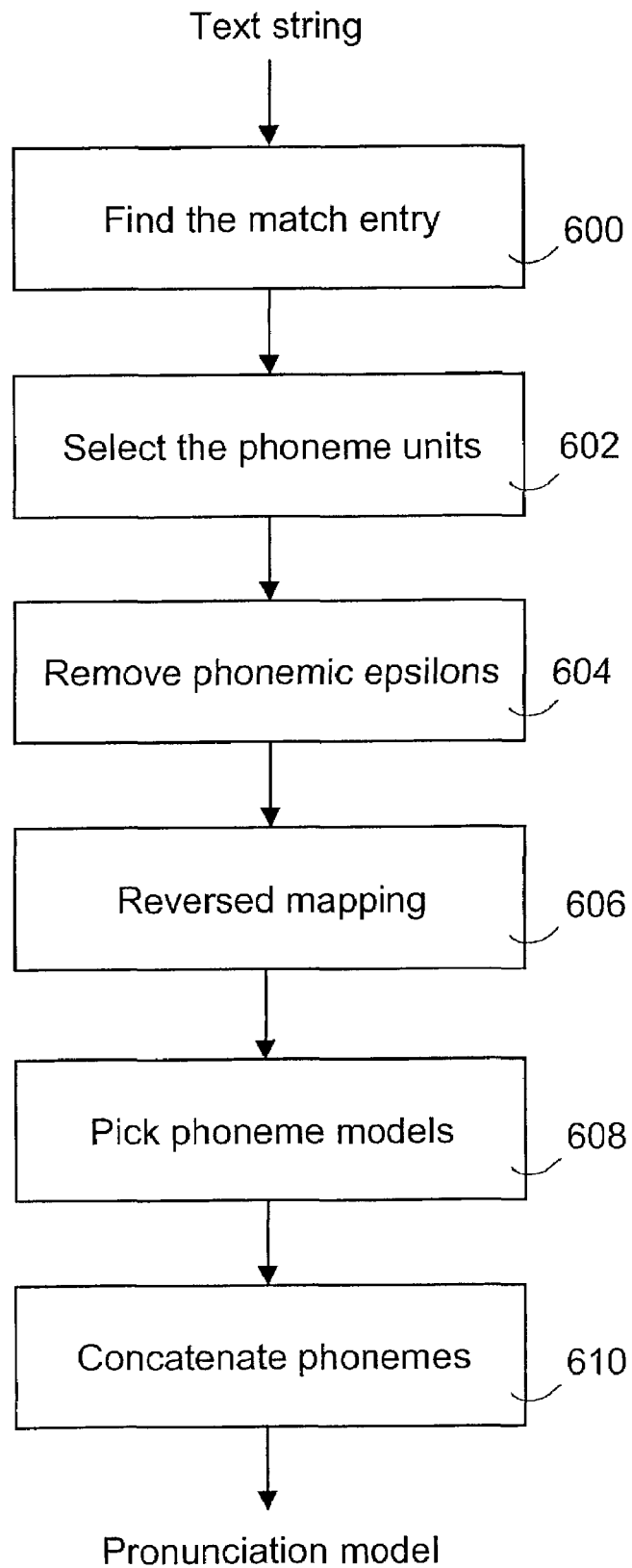
FIG. 6 is a flow chart illustrating the use of the preprocessed pronunciation dictionary when a text string is converted into a pronunciation model according to a preferred embodiment of the invention.
Figure 7:
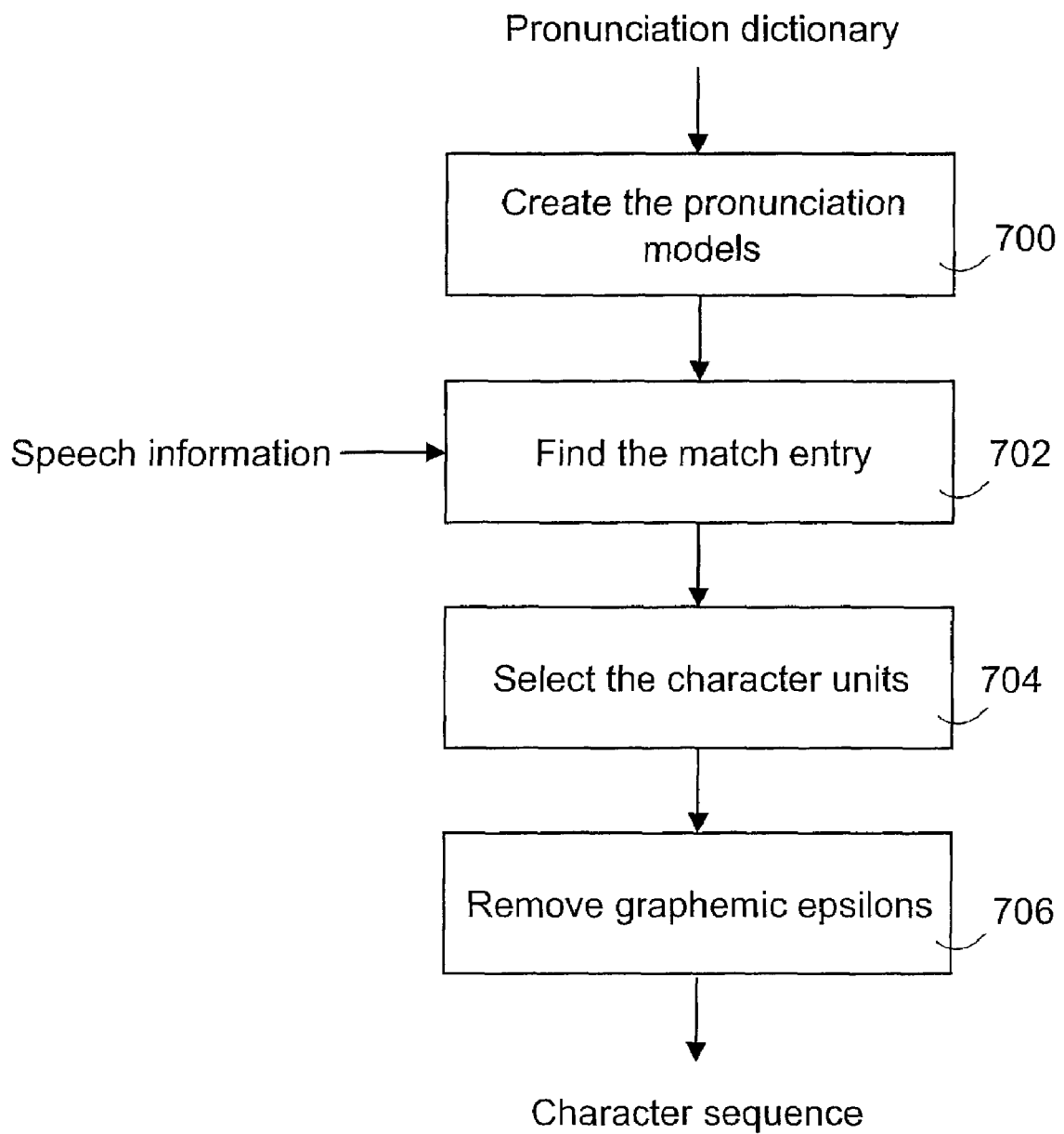
FIG. 7 is a flow chart illustrating the use of the preprocessed pronunciation dictionary when speech information is converted into a sequence of text units according to a preferred embodiment of the invention.

The steps shown in FIGS. 6 and 7 may be implemented with a computer program code executed in the central processing unit (PRO) of the electronic device (ED). The computer program can be loaded into the central processing unit (PRO) through the I/O means (IO). The implementation can also be done with a hardware solution (e.g. ASIC) or with a combination of these two. According to one preferred embodiment, the phoneme dictionary stored in the memory (ME) of the device (ED) is pre-processed as described in FIG. 2.

In FIG. 6 the central processing unit (PRO) of the electronic device (ED) receives a text string input that needs to be converted into a pronunciation model. The input text string may be for instance a name the user has added using I/O means (IO) to a contact database of the electronic device (ED). First a matching entry needs to be found (600) from the pre-processed pronunciation dictionary that is stored in the memory (ME). Finding the matching entry is based on comparing the input text string to the character units of the entries. Because the entries are interleaved, an entry string is a combination of character and phoneme units. If the interleaving is done according to the preferred embodiment described in FIG. 2, when comparing the input string to the entry, only every second unit is used. The character units of the entry can be found by selecting odd units, starting from the first. The comparison is made with the original character string of the entry, and therefore empty spaces, e.g. graphemic epsilons, are ignored. There are several methods and algorithms for finding the match entry known to a skilled person as such, and there is no need to describe them here, since they are not a part of the invention. When the character units exactly match to the units of the input text string, the matching entry is found. However, it should be understood that in some applications it might be advantageous to use a non-exact matching algorithm instead, for example one utilizing so-called wildcards.

When the matching entry is found, the phoneme units of the entry are selected (602). Because of the interleaving (done according to the preferred embodiment described in FIG. 2), every second unit of the entry string is used. In order to determine the phoneme units, the selection is started from the second unit. The selected units can then be concatenated to create the sequence of phonemic units.

As the entries are aligned, the sequence of phoneme units may include empty spaces, e.g. phonemic epsilons. The empty spaces are removed in order to create a sequence consisting only of phonemes (604).

If the pre-processing of the phoneme dictionary also included mapping, a reversed mapping is needed (606). The reversed mapping can be carried out using a similar mapping table as the one used during the pre-processing, but in a reverse order. This step changes the first representation method, e.g. one character representation, of the phonemic units into the second representation method, e.g. SAMPA, that is used in the system.

When the sequence of phoneme units is created, it is typically further processed, e.g. a pronunciation model of the sequence is created. According to one embodiment a pronunciation model is created for each phoneme using e.g. HMM-algorithm. The phoneme pronunciation models are stored in the memory (ME). To create a pronunciation model of an entry, a pronunciation model for each phoneme of the phoneme sequence is retrieved from the memory (608). These phoneme models are then concatenated (610) and the pronunciation model for the phoneme sequence is created.

The converting of a text string input into a pronunciation model described above can also be distributed between two electronic devices. For instant, the pre-processed dictionary is stored in the first electronic device, e.g. in the network, where the finding of a matching entry (600) is performed. The matching entry is then distributed to the second electronic device, e.g. a mobile terminal, where the rest of the process (steps 602–610) is performed.

FIG. 7 illustrates one preferred embodiment of converting a speech information into a sequence of character units in an electronic device (ED) that utilises a pre-processed pronunciation dictionary. The central processing unit (PRO) of the electronic device (ED) receives a speech information input through the I/O means (IO). This speech information needs to be converted into a sequence of character units for further usage e.g. to show it as text on the display or to compare it with a text string of a pre-determined speech command of a speech controlled device.

Finding a matching entry (702) is based on comparing the input speech information to the pronunciation models of each entry in the pronunciation dictionary. Therefore, before the comparison, the pronunciation of each entry is modelled (700). According to one preferred embodiment, the models are created in the electronic device (ED). The phoneme dictionary is already interleaved and aligned, therefore the modelling can be done as described in FIG. 6, following the steps 602–610. When the modelling is done in the electronic device (ED) the need for processing capacity and working memory is increased. Instead the memory consumption for storing the pronunciation dictionary can be kept low.

According to a second preferred embodiment, the models are created before the pre-processing of the pronunciation dictionary in the data processing device (TE). The modelling can be done as described in FIG. 6, following the steps 608 and 610. Because the modelling is done before the pre-processing and the dictionary is not yet interleaved, aligned or mapped, the steps 602–606 are not needed. The pronunciation model is then stored into the memory (MEM) together with the entry. When the dictionary is transferred to the electronic device (ED) also the models are transferred. In this solution, less processing capacity and working memory is needed for converting speech information into a text sequence. Instead the memory consumption of the storage memory (ME) is increased.

The finding of a match entry (702) is done using the input speech information and the pronunciation models of the entries stored in the memory (ME). The speech information is compared with each entry and a probability of how well the input speech information matches with each entry's pronunciation model is computed. After computing the probabilities the match entry can be found by selecting the entry with the highest probability.

The character units are then selected from the matching entry (704). Because of the interleaving, done as described in FIG. 2, every second unit of the entry string is used. The selecting must start from the first unit to obtain the character units. These selected units can then be concatenated to form a sequence of graphemic units.

Because of the aligning, the sequence of the graphemic units may include empty spaces, e.g. graphemic epsilons. To create a sequence that has only graphemes, the empty spaces are removed (706). As a result we have a text string that can be used further in the system.

An electronic device, e.g. a mobile phone with a car user interface, has a speaker-independent voice recognition for voice commands. Each voice command is an entry in the pronunciation dictionary. The user wants to make a phone call while driving. When the voice recognition is active the user says 'CALL'. The phone receives the voice command with a microphone and transmits the speech information through the I/O means to the central processing unit. The central processing unit converts the speech input into a text sequence as described in FIG. 7. The text sequence is transmitted through the I/O means to the display to give the user feedback of what the device is doing. Besides the text on the screen, the device also gives audio feedback. The pronunciation model of the match entry, which was created as a part of the speech-to-text conversion process, is transferred through the I/O means to the loudspeaker. The phone then makes a phone call to the number that the user has selected.

The accompanying drawings and the description pertaining to them are only intended to illustrate the present invention. Different variations and modifications to the invention will be apparent to those skilled in the art, without departing from the scope and spirit of the invention defined in the appended claims.

The invention claimed is:

1. A method for pre-processing a pronunciation dictionary for compression in a data processing device, the pronunciation dictionary comprising at least one entry, the entry comprising a sequence of character units and a sequence of phoneme units, the method comprising:
aligning said sequence of character units and said sequence of phoneme units using a statistical algorithm so that the alignment between said character units and said phoneme units is determined; and
interleaving said aligned sequence of character units and said aligned sequence of phoneme units by inserting each phoneme unit at a predetermined location relative to the corresponding character unit.

2. The method of claim 1, wherein said alignment is determined by employing the statistical algorithm, a HMM-Viterbi algorithm.

3. The method of claim 1, wherein said phoneme units are located next to corresponding character units.

4. The method of claim 1, wherein said aligned sequence of character units and said aligned sequence of phoneme units are made to include an equal number of units by at least one of the following insertions:
inserting graphemic epsilons to said sequence of character units; and
inserting phonemic epsilons into said sequence of phoneme units.

5. The method of claim 1, wherein said character units are letters or white space characters.

6. The method of claim 1, wherein said phoneme units are letters or whitespace characters representing a single phoneme or a phonemic epsilon and one said unit is denoted by at least one character.

7. The method of claim 1, the method further comprising:
mapping each phoneme unit into one symbol.

8. A computer program product loadable into the memory of a data processing device, comprising a code which is executable in the data processing device causing the data processing device to:
retrieve from the memory a pronunciation dictionary comprising at least one entry, the entry comprising a sequence of character units and a sequence of phoneme units;
align said sequence of character units and said sequence of phoneme units using a statistical algorithm; and
interleave said aligned sequence of character units and said aligned sequence of phoneme units by inserting each phoneme unit at a predetermined location relative to the corresponding character unit.

9. A data processing device comprising memory for storing a pronunciation dictionary comprising at least one entry, the entry comprising a sequence of character units and a sequence of phoneme units, wherein
the data processing device is configured to retrieve from the memory a pronunciation dictionary comprising at least one entry;
the data processing device is configured to align said sequence of character units and said sequence of phoneme units using a statistical algorithm; and
the data processing device is configured to interleave said aligned sequence of character units and said aligned sequence of phoneme units by inserting each phoneme unit at a predetermined location relative to the corresponding character unit.

10. The data processing device of claim 9, wherein the data processing device is configured to determine said alignment by employing the statistical algorithm, a HMM-Viterbi algorithm.

11. The data processing device of claim 9, wherein the data processing device is configured to locate said phoneme units next to corresponding character units.

12. The data processing device of claim 9, wherein the data processing device is configured to cause said aligned sequence of character units and said aligned sequence of phoneme units include an equal number of units by at least one of the following insertions:
inserting graphemic epsilons to said sequence of character units; and
inserting phonemic epsilons into said sequence of phoneme units.

13. The data processing device of claim 9, wherein said character units are letters or whitespace characters.

14. The data processing device of claim 9, wherein said phoneme units are letters or whitespace characters representing a single phoneme or a phonemic epsilon and one said unit is denoted by at least one character.

15. The data processing device of claim 9, wherein the data processing device is configured to map each phoneme unit into one symbol.

* * * * *